United States Patent
Wang

(10) Patent No.: US 12,527,165 B2
(45) Date of Patent: Jan. 13, 2026

(54) ORGANIC LIGHT-EMITTING DIODE DISPLAY PANEL AND METHOD OF MANUFACTURING SAME

(71) Applicant: Shenzhen China Star Optoelectronics Semiconductor Display Technology Co., Ltd., Shenzhen (CN)

(72) Inventor: Guojie Wang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 476 days.

(21) Appl. No.: 17/988,080

(22) Filed: Nov. 16, 2022

(65) Prior Publication Data

US 2024/0114723 A1 Apr. 4, 2024

(30) Foreign Application Priority Data

Sep. 30, 2022 (CN) .......................... 202211216694.3

(51) Int. Cl.
*H10K 59/122* (2023.01)
*H10K 71/00* (2023.01)

(52) U.S. Cl.
CPC .......... *H10K 59/122* (2023.02); *H10K 71/00* (2023.02)

(58) Field of Classification Search
None
See application file for complete search history.

(56) References Cited

U.S. PATENT DOCUMENTS

| | | | |
|---|---|---|---|
| 2005/0236629 A1* | 10/2005 | Lee | H10K 50/824 257/79 |
| 2020/0043998 A1* | 2/2020 | Choi | H10K 50/11 |
| 2021/0175302 A1* | 6/2021 | Cui | H10K 59/122 |
| 2023/0363203 A1* | 11/2023 | Zhang | H10K 59/353 |
| 2024/0292663 A1* | 8/2024 | Wang | H10K 59/80515 |

FOREIGN PATENT DOCUMENTS

| | | |
|---|---|---|
| CN | 110620133 A | 12/2019 |
| CN | 113013357 A | 6/2021 |
| CN | 114759071 A | 7/2022 |

OTHER PUBLICATIONS

Chinese Office Action issued in corresponding Chinese Patent Application No. 202211216694.3 dated Jul. 16, 2025, pp. 1-7.

* cited by examiner

*Primary Examiner* — Michelle Mandala
(74) *Attorney, Agent, or Firm* — Nathan & Associates Patent Agents Ltd.; Menachem Nathan Nathan

(57) ABSTRACT

An organic light-emitting diode (OLED) display panel and a method of manufacturing the OLED display panel are provided. The OLED display panel includes: a substrate; an anode disposed on the substrate; and a pixel defining layer disposed on the substrate. The pixel defining layer is provided with a pixel opening. The anode extends into the pixel opening. A length of the pixel opening along a first direction is greater than a part of the anode disposed in the pixel opening along the first direction. Therefore, an operation space for inkjet printing can be enlarged without changing a length of the anode. As such, four or more nozzles can be simultaneously used to print an organic light-emitting layer in a same pixel in bottom-emitting OLED devices, and an uneven brightness issue can be solved.

13 Claims, 14 Drawing Sheets

ORGANIC LIGHT-EMITTING DIODE DISPLAY PANEL AND METHOD OF MANUFACTURING SAME

FIELD

The present disclosure relates to a field of display technologies, and more particularly, to an organic light-emitting diode (OLED) display panel and a method of manufacturing the OLED display panel.

BACKGROUND

Organic light-emitting diode (OLED) devices have become a mainstream display technology because they have characteristics such as self-luminescence, wide viewing angles, high contrast, fast response times, and a light and thin body. Compared with manufacturing OLED devices by vacuum deposition with a fine metal mask (FMM), using an inkjet printing method to manufacture OLED devices is more popular because it can realize a precise alignment without using a fine metal mask and can achieve 100% usage rate of material. Thus, using the inkjet printing method to manufacture large-scale OLED devices has become a mainstream trend.

Typically, a pixel arrangement structure of OLEDs is formed of multiple pixel dots. Each of the pixel dots includes a red sub-pixel, a green sub-pixel, and a blue sub-pixel. Multiple red sub-pixels, green sub-pixels, and blue sub-pixels are arranged sequentially and repeatedly to form a matrix. The inkjet printing method is to print organic light-emitting ink onto a specific position by multiple nozzles to form an organic light-emitting layer. However, due to hardware discrepancy between the nozzles, sizes of ink drops injected by the nozzles are different, leading to different sizes of organic light-emitting layers of the pixels. Consequently, brightness of OLED devices would be uneven.

Currently, a solution to solve the above technical issues is: simultaneously using four or more nozzles to print a pixel. This can realize error variance and alleviate size discrepancy between organic light-emitting layers of pixels. Thus, an uneven brightness issue can be solved. This solution is available according to theoretical calculations and actual experiments. However, a problem of this solution is: when four nozzles are used to form ink drops in a pixel, gaps are formed between adjacent nozzles. Nowadays, a minimum distance between centers of adjacent ink drops is 21.167 µm, and therefore a total length of four ink drops is 21.167*3=63.501 µm. Deviation of precision of positions of the ink drops injected by the nozzles would inevitably occur. Currently, a minimum deviation is ±20 µm. As such, to solve a problem of uneven brightness, a minimum length of an organic light-emitting layer of a pixel should be at least 103.5 µm, which cannot be realized in bottom-emitting OLED devices.

SUMMARY

The present disclosure provides an OLED display panel and a method of manufacturing the OLED display panel to solve an uneven brightness issue of OLED display panels.

The present disclosure provides an OLED display panel, comprising:
a substrate;
an anode disposed on the substrate; and
a pixel-defining layer disposed on the substrate, wherein the pixel-defining layer is provided with a pixel opening, and the anode extends into the pixel opening;
wherein a length of the pixel opening along a first direction is greater than a length of a part of the anode disposed in the pixel opening along the first direction.

Optionally, in some embodiments of the present disclosure, a length of the pixel opening along a second direction is greater than a length of a part of the anode disposed in the pixel opening along the second direction, and the first direction is perpendicular to the second direction.

Optionally, in some embodiments of the present disclosure, a first gap is defined between the first pixel opening and anode along the first direction and is provided with a first filling layer.

Optionally, in some embodiments of the present disclosure, a surface of the anode in contact with the first filling layer is a first contact surface, a surface of the first filling layer in contact with the anode is a second contact surface, and the second contact surface is defined on the first contact surface.

Optionally, in some embodiments of the present disclosure, an end of the anode abuts against an internal wall of the pixel opening along the first direction, and the first gap is defined between another end of the anode and the internal wall of the pixel opening along the first direction.

Optionally, in some embodiments of the present disclosure, a second gap is defined between the pixel opening and the anode along the second direction and is provided with a second filling layer.

Optionally, in some embodiments of the present disclosure, a surface of the anode in contact with the second filling layer is a third contact surface, a surface of the second filling layer in contact with the anode is a fourth contact surface, and the fourth contact surface is defined on the third contact surface.

Optionally, in some embodiments of the present disclosure, an end of the anode abuts against an internal wall of the pixel opening along the second direction, and the second gap is defined between another end of the anode and the internal wall of the pixel opening along the second direction.

Optionally, in some embodiments of the present disclosure, the OLED display panel further comprises:
an organic light-emitting layer disposed on the anode;
wherein the organic light-emitting layer is filled in a first gap defined between the pixel opening and the anode along the first direction.

Optionally, in some embodiments of the present disclosure, the OLED display panel further comprises:
an organic light-emitting layer disposed on the anode;
wherein the organic light-emitting layer is filled in a second gap defined between the pixel opening and the anode along the second direction.

Correspondingly, the present disclosure provides a method of manufacturing an organic light-emitting diode (OLED) display panel, comprising following steps:
providing a substrate, and forming an anode on the substrate;
forming a pixel defining layer on the substrate, wherein the pixel defining layer is provided with a pixel opening, the anode extends into the pixel opening, and a length of the pixel opening along a first direction is greater than a length of a part the anode disposed in the pixel opening along the first direction.

Optionally, in some embodiments of the present disclosure, the method comprises a following step:

when the pixel defining layer is formed, forming a first filling layer in a first gap defined between the pixel opening and the anode along the first direction.

Optionally, in some embodiments of the present disclosure, the method comprises a following step:

when the pixel defining layer is formed, forming a second filling layer in a second gap defined between the pixel opening and the anode along a second direction.

Optionally, in some embodiments of the present disclosure, the method comprises a following step:

forming an organic light-emitting layer on the pixel defining layer, wherein the organic light-emitting layer is disposed on the anode, the organic light-emitting layer is disposed in a first gap defined between the pixel opening and the anode, and the organic light-emitting layer is formed by an inkjet printing method.

The present disclosure provides an OLED display panel and a method of manufacturing the OLED display panel. The OLED display panel includes: a substrate; an anode disposed on the substrate; and a pixel defining layer disposed on the substrate. The anode extends into the pixel opening. A length of the pixel opening along a first direction is greater than a length of a part of the anode disposed in the pixel opening along the first direction. In the present disclosure, the length of the pixel opening along the first direction is greater than the length of the anode disposed in the pixel opening along the first direction. Therefore, an operation space for inkjet printing can be enlarged without changing a length of the anode. As such, four or more nozzles can be simultaneously used to print an organic light-emitting layer in a same pixel in bottom-emitting OLED devices, and an uneven brightness issue can be solved.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
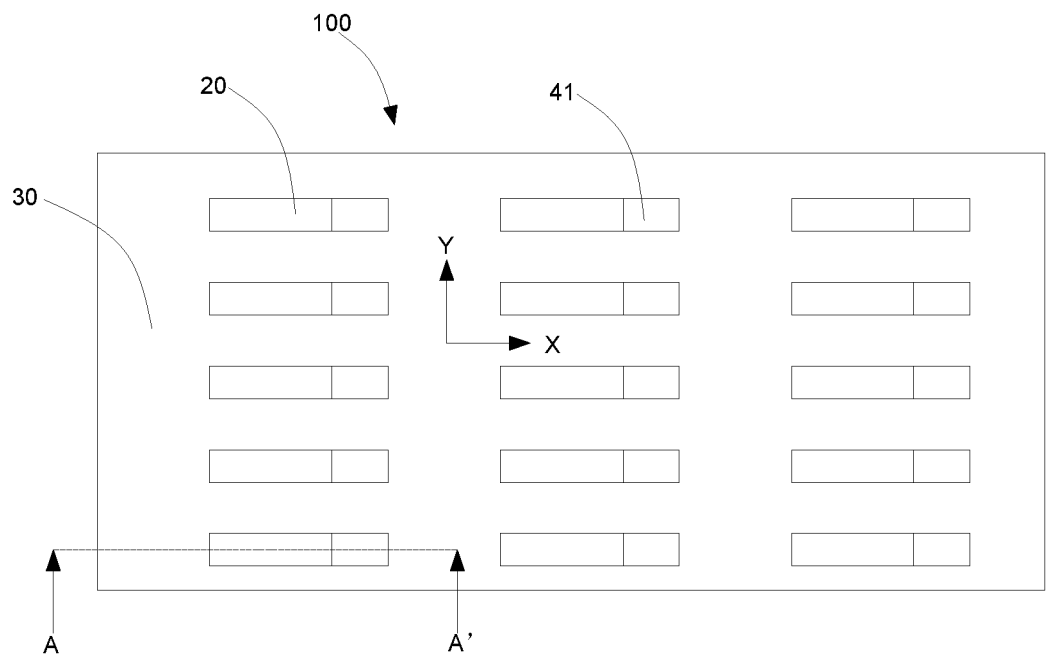
FIG. 1 is a first structural schematic view showing an OLED display panel provided by the present disclosure.

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one of these features. In the description of the present disclosure, "a plurality of" relates to two or more than two, unless otherwise specified.

The present disclosure provides an OLED display panel and a method of manufacturing the OLED display panel, which are described in detail below. It should be noted that a description order of following embodiments does not mean a preferred order of the embodiments.

Figure 2:
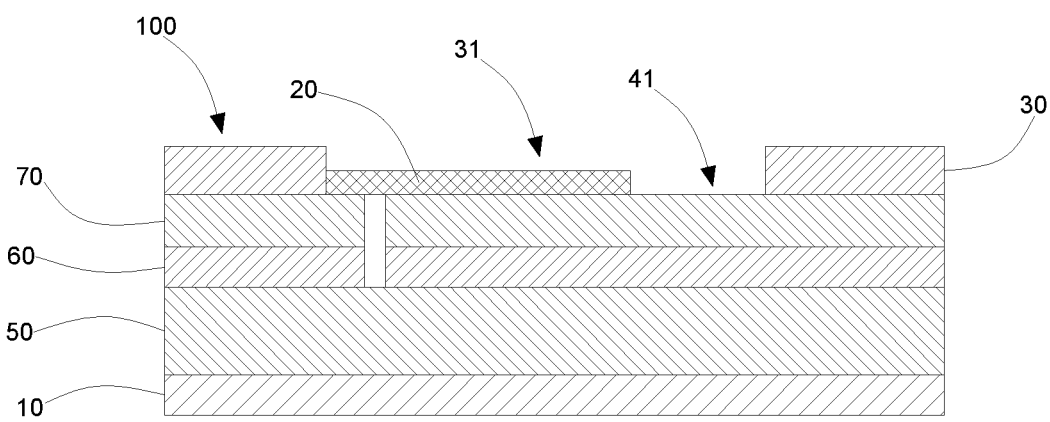
FIG. 2 is a cross-sectional view of FIG. 1 taken along a direction A-A'.

Please refer to FIGS. 1 and 2. FIG. 1 s a first structural schematic view showing an OLED display panel 100 provided by the present disclosure. FIG. 2 is a cross-sectional view of FIG. 1 taken along a direction A-A'. An embodiment of the present disclosure provides the OLED display panel 100, including: a substrate 10, an anode 20, and a pixel defining layer 30.

The anode 20 is disposed on the substrate 10. The pixel defining layer 30 is disposed on the substrate 10. The pixel defining layer 30 is provided with a pixel opening 31. The anode 20 extends into the pixel opening 31. A length of the pixel opening 31 along a first direction X is greater than a length of a part of the anode 20 disposed in the pixel opening 31 along the first direction X. That is, a first gap 41 is defined between the pixel opening 31 and the anode 20 along the first direction X.

In addition, the OLED display panel 100 includes multiple pixel openings 31. The pixel openings 31 are arranged in an array manner. The first direction X may be a row direction or a column direction of the array.

In the present disclosure, the length of the pixel opening 31 along the first direction X is greater than the length of the anode 20 disposed in the pixel opening 31 along the first direction X. Therefore, an operation space for inkjet printing can be enlarged without changing a length of the anode 20. As such, four or more nozzles can be simultaneously used to print an organic light-emitting layer 80 in a same pixel in bottom-emitting OLED devices. Due to hardware discrepancy between nozzles, sizes of ink drops injected by nozzles are different. Using four or more nozzles to print a pixel of the organic light-emitting layer 80 can realize error variance and alleviate size discrepancy between pixels of the organic light-emitting layer 80, thereby solving an uneven brightness issue.

In some embodiments, the OLED display panel 100 may further include: a thin-film transistor (TFT) layer 50, an insulating layer 60, and a planarization layer 70.

The TFT layer 50 is disposed on the substrate 10. The insulating layer 60 is disposed on a side of the TFT layer 50 away from the substrate 10. The planarization layer 70 is disposed on a side of the insulating layer 60 away from the substrate 10. The anode 20 is disposed on a side of the planarization layer 70 away from the substrate 10.

The anode 20 and the TFT layer 50 can be insulated from each other because of the insulating layer 60. The planarization layer 70 can improve flatness. The anode 20 is connected to a drain and a source disposed on the TFT layer 50.

Figure 3:
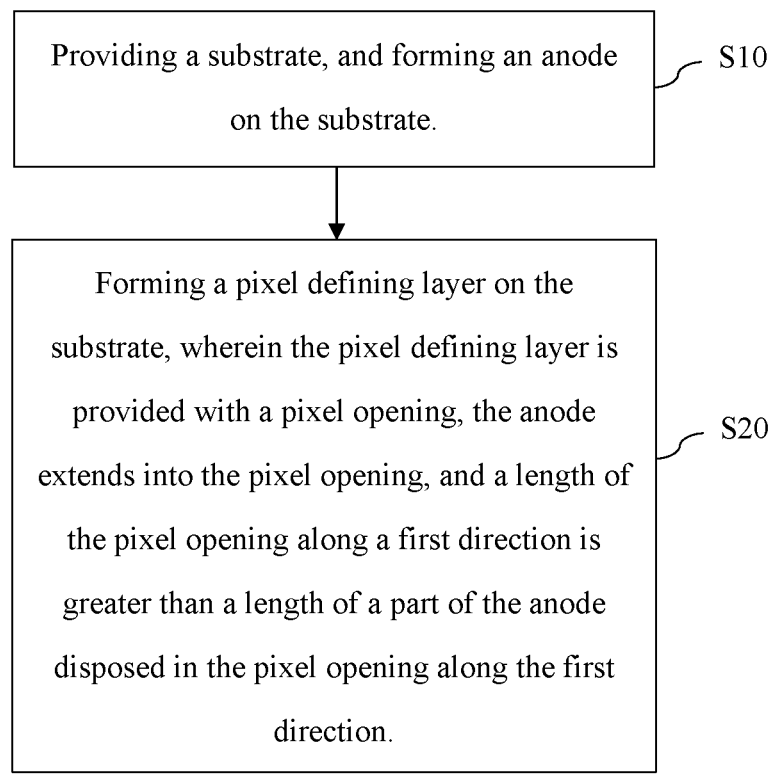
FIG. 3 is a flowchart showing a method of manufacturing the OLED display panel provided by a first embodiment of the present disclosure.

Please refer to FIG. 3. FIG. 3 is a first flowchart showing a method of manufacturing the OLED display panel 100 provided by the present disclosure. Correspondingly, an embodiment of the present disclosure further provides a method of manufacturing the OLED display panel 100, including following steps:

S10, providing the substrate 10, and forming the anode 20 on the substrate 10.

S20, forming the pixel defining layer 30 on the substrate 10. The pixel defining layer 30 is provided with the pixel opening 31. The anode 20 extends into the pixel opening 31. The length of the pixel opening 31 along the first direction X is greater than the length of the part of the anode 20 disposed in the pixel opening 31 along the first direction X.

In addition, the OLED display panel 100 includes multiple pixel openings 31. The pixel openings 31 are arranged in an array manner. The first direction X may be a row direction or a column direction of the array.

In the present disclosure, the length of the pixel opening 31 along the first direction X is greater than the length of the anode 20 disposed in the pixel opening 31 along the first direction X. Therefore, an operation space for inkjet printing can be enlarged without changing a length of the anode 20.

As such, four or more nozzles can be simultaneously used to print an organic light-emitting layer 80 in a same pixel in bottom-emitting OLED devices. Due to hardware discrepancy between nozzles, sizes of ink drops injected by the nozzles are different. Using four or more nozzles to print a pixel of the organic light-emitting layer 80 can realize error variance and alleviate size discrepancy between pixels of the organic light-emitting layer 80, thereby solving an uneven brightness issue.

Figure 4:
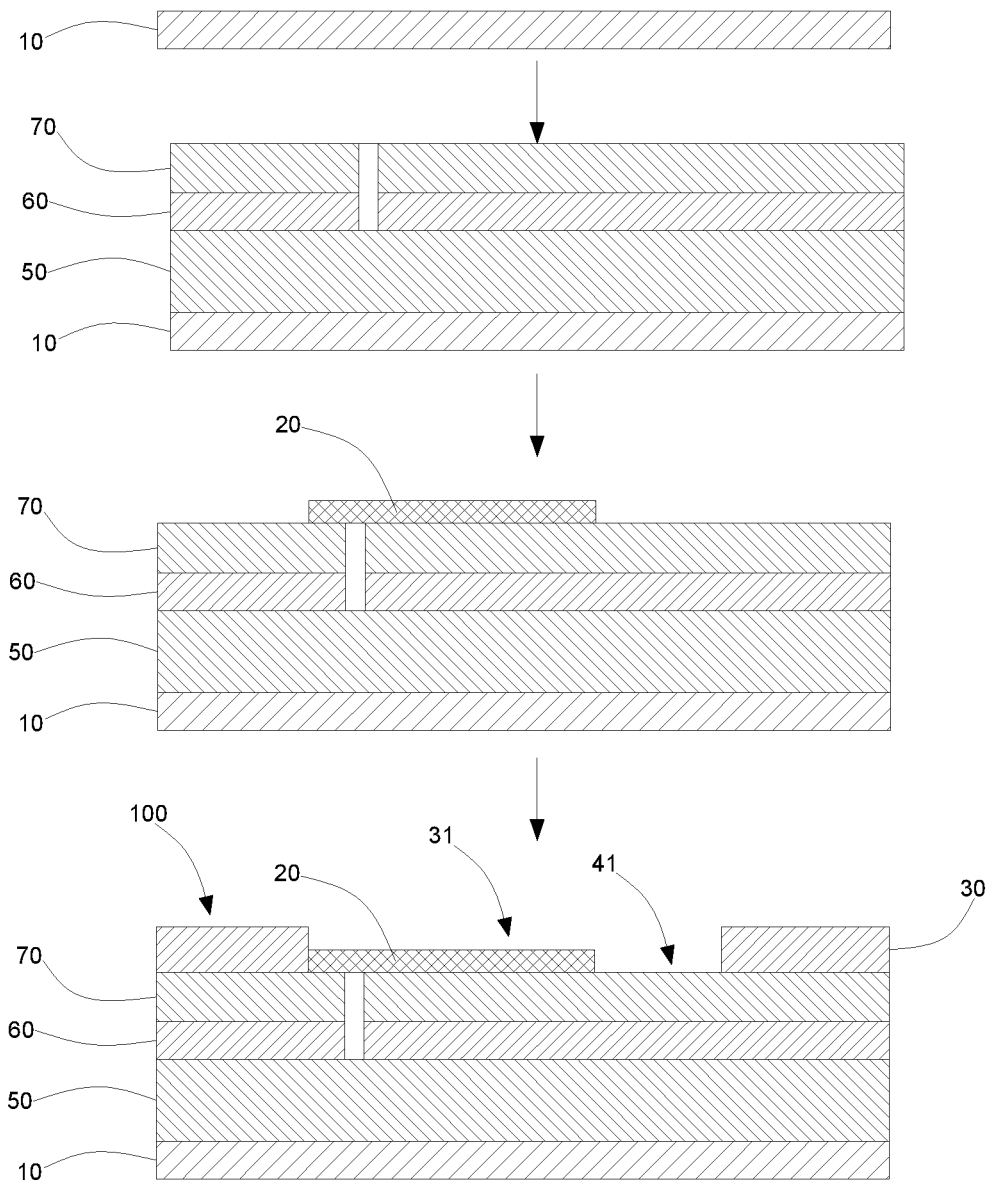
FIG. 4 is a flowchart showing a method of manufacturing a first structure of the OLED display panel provided by the present disclosure.

Please refer to FIG. 4. FIG. 4 is a flowchart showing a method of manufacturing a first structure of the OLED display panel 100 provided by the present disclosure. First, the substrate 10 is provided, and the TFT layer 50, the insulating layer 60, and the planarization layer 70 are sequentially formed on the substrate 10. Then, the anode 20 is formed on the planarization layer 70. Finally, the pixel defining layer 30 is formed on the planarization layer 70. The pixel defining layer 30 is provided with the pixel opening 31. The anode 20 extends into the pixel opening 31. The length of the pixel opening 31 along a first direction X is greater than the length of the part of the anode 20 disposed in the pixel opening 31 along the first direction X. That is, the first gap 41 is defined between the pixel opening 31 and the anode 30 along the first direction X.

Figure 5:
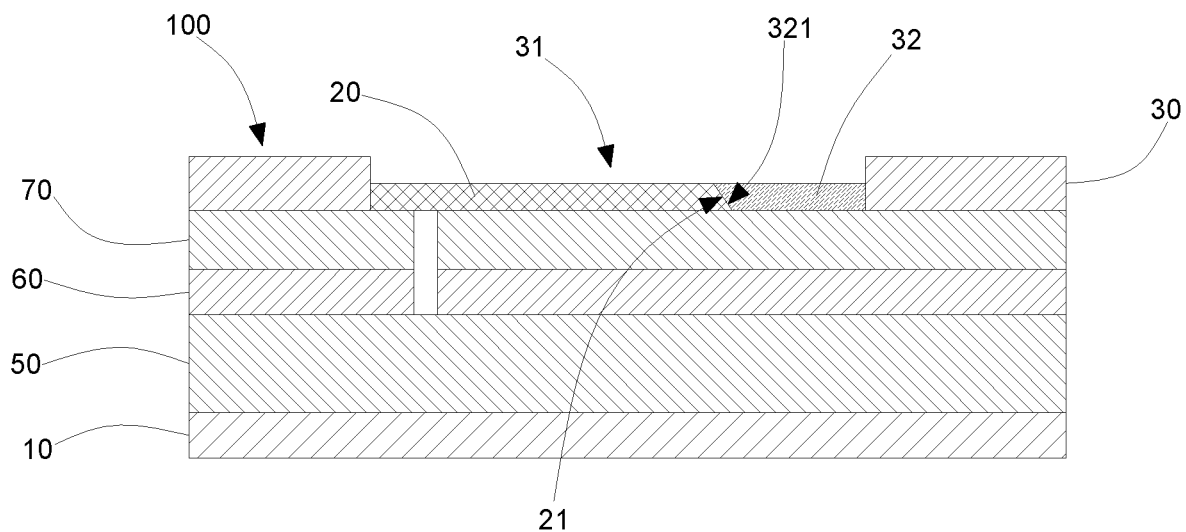
FIG. 5 is a second structural schematic view showing the OLED display panel provided by the present disclosure.

Please refer to FIG. 5. FIG. 5 is a second structural schematic view showing the OLED display panel 100 provided by the present disclosure. A first filling layer 32 is disposed in the first gap 41 defined between the pixel opening 31 and the anode 20. A thickness of the first filling layer 32 and a thickness of the anode 20 can be same or different. In the present embodiment, the thickness of the first filling layer 32 and the thickness of the anode 20 are same. The filling layer 32 can ensure flatness of the anode 20, thereby improving a contact effect between the anode 20 and the organic light-emitting layer 80.

Furthermore, a surface of the anode 20 in contact with the first filling layer 32 is a first contact surface 21. A surface of the first filling layer 32 in contact with the anode 20 is a second contact surface 321. The second contact surface 321 is defined on the first contact surface 21.

In the present disclosure, the second contact surface 321 is defined on the first contact surface 21. As such, the first filling layer 32 can cover the anode 20, preventing the anode 20 from warpage.

Specifically, the first contact surface 21 and the second contact surface 321 are inclined surfaces. Because the first contact surface 21 and the second contact surface 321 are inclined surfaces cooperated with each other, the first filling layer 32 can cover the anode 20. In other embodiments of the present disclosure, the first contact surface 21 and the second contact surface 321 may be concave step surfaces.

Moreover, an end of the anode 20 along the first direction X abuts against an internal wall of the pixel opening 31. The first gap 41 is defined between another end of the anode 20 along the first direction X and the internal wall of the pixel opening 31. The first gap 41 is provided with the first filling layer 32. That is, only one end between the anode 20 and the internal wall of the pixel opening 31 along the first direction X is provided with a gap, which can alleviate affection due to contact between the anode 20 and the light-emitting layer 80.

In addition, the first filling layer 32 and the pixel defining layer 30 are made of same material. That is, the first filling layer 32 and the pixel defining layer 30 can be formed simultaneously. Specifically, the anode 20 is first disposed on the substrate 10, and then the pixel defining layer 30, together with the first filling layer 32, is formed on the substrate 10. Thus, manufacturing processes can be reduced, thereby reducing manufacturing cost. A translucent mask can be used during manufacturing processes of the pixel defining layer 30 and the first filling layer 32. The translucent mask includes a transparent area, an opaque area, and a translucent area. Because the translucent mask has areas having different light-transmitting degrees, the pixel defining layer 30 and the first filling layer 32 having different thicknesses can be formed simultaneously. As such, manufacturing steps can be reduced, and working efficiency is significantly improved.

Figure 6:
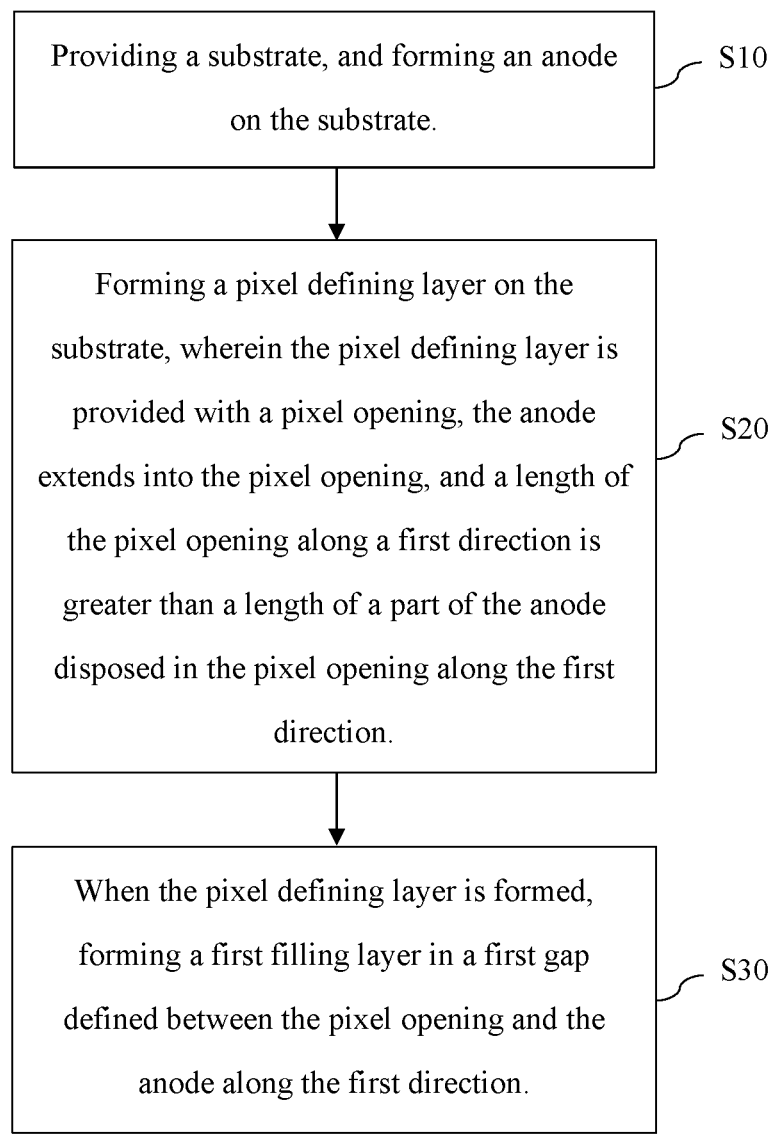
FIG. 6 is a flowchart showing a method of manufacturing the OLED display panel provided by a second embodiment of the present disclosure.

Please refer to FIG. 6. FIG. 6 is a flowchart showing a method of manufacturing the OLED display panel 100 provided by a second embodiment of the present disclosure. Correspondingly, an embodiment of the present disclosure further provides a method of manufacturing the OLED display panel 100, including following steps:

S10, providing the substrate 10, and forming the anode 20 on the substrate 10.

S20, forming the pixel defining layer 30 on the substrate 10. The pixel defining layer 30 is provided with the pixel opening 31. The anode 20 extends into the pixel opening 31. The length of the pixel opening 31 along the first direction X is greater than the length of the part of the anode 20 disposed in the pixel opening 31 along the first direction X.

S30, when the pixel defining layer 30 is formed, forming the first filling layer 32 in the first gap 41 defined between the pixel opening 31 and the anode 20 along the first direction X.

In the present disclosure, the first filling layer 32 can ensure flatness of the anode 20, thereby improving a contact effect between the anode 20 and the light-emitting layer 80. In addition, the first filling layer 32 and the pixel defining layer 30 can be formed simultaneously. As such, manufacturing processes can be reduced, thereby reducing manufacturing cost.

Figure 7:
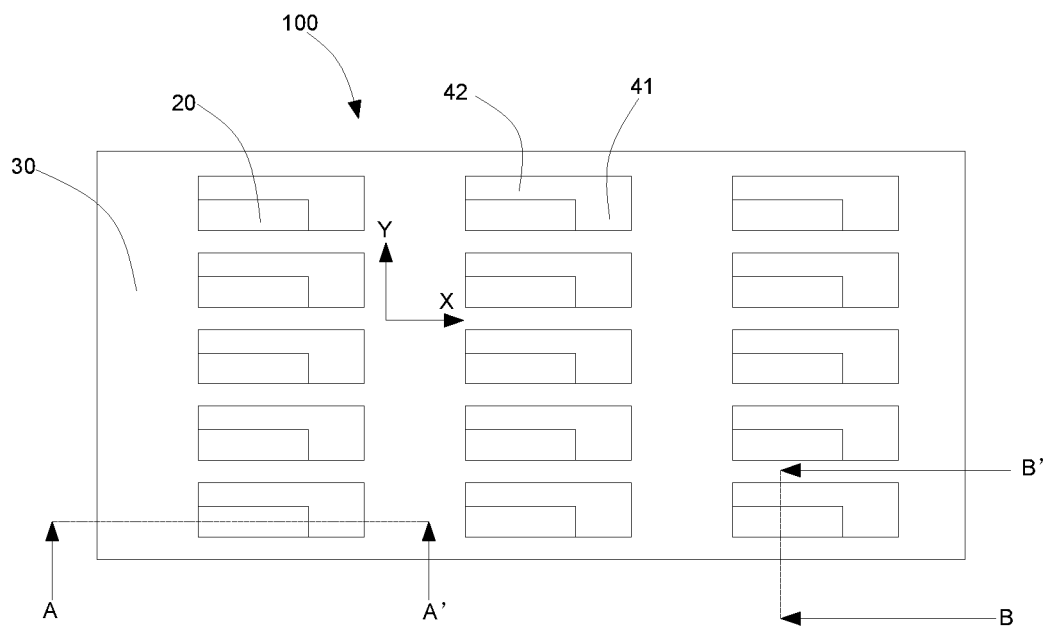
FIG. 7 is a third structural schematic view showing the OLED display panel provided by the present disclosure.
Figure 8:
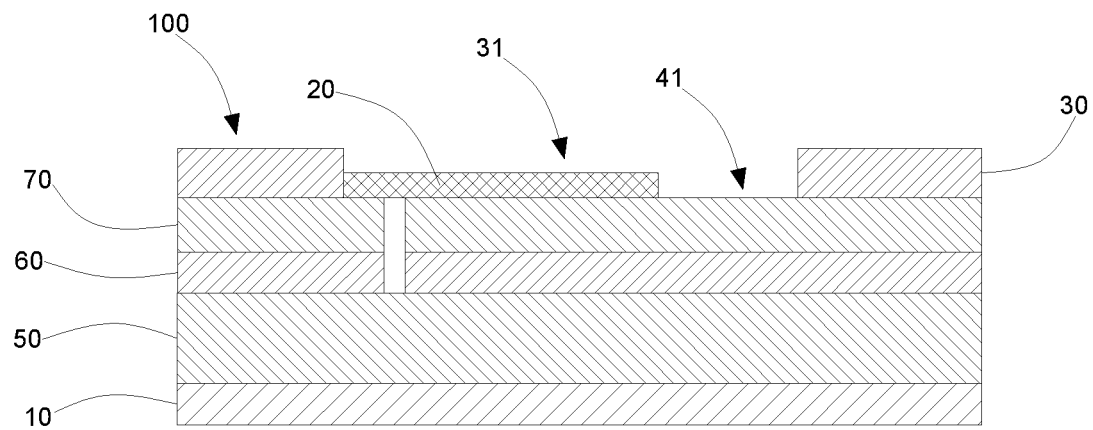
FIG. 8 is a cross-sectional view of FIG. 7 taken along a direction A-A'.
Figure 9:
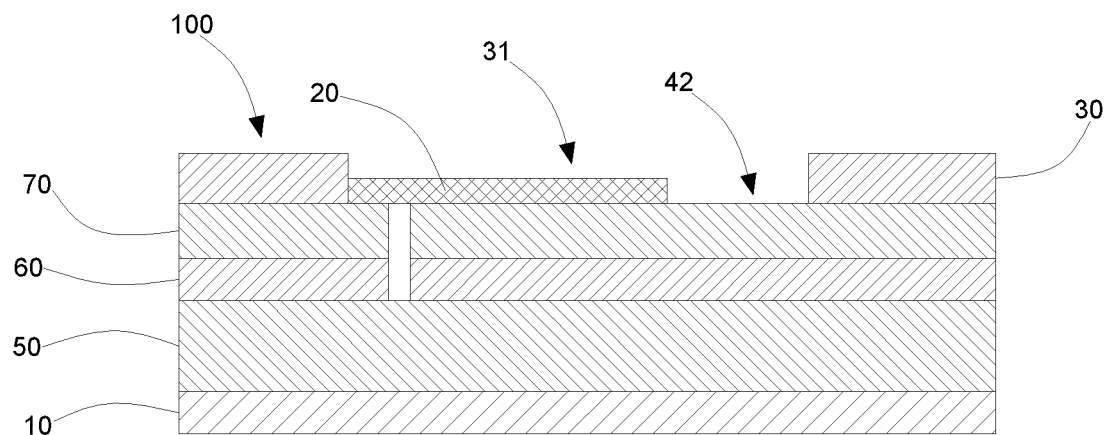
FIG. 9 is a cross-sectional view of FIG. 7 taken along a direction B-B'.

Please refer to FIGS. 7 to 9. FIG. 7 is a third structural schematic view showing the OLED display panel 100 provided by the present disclosure. FIG. 8 is a cross-sectional view of FIG. 7 taken along a direction A-A'. FIG. 9 is a cross-sectional view of FIG. 8 taken along a direction B-B'. In the present embodiment, on the basis of the OLED display panel 100 as shown in FIG. 1 and FIG. 5, a length of the pixel opening 31 along a second direction Y is greater than a part of the anode 20 disposed in the pixel opening 31 along the second direction Y, and the first direction X is perpendicular to the second direction Y. That is, a second gap 42 is defined between the pixel opening 31 and the anode 20 along the second direction Y.

The OLED display panel 100 includes multiple pixel openings 31. The pixel openings 31 are arranged in an array manner. The second direction Y may be a column direction or a row direction of the array.

In the present disclosure, the length of the pixel opening 31 along the first direction X is greater than the length of the anode 20 disposed in the pixel opening 31 along the first direction X. Therefore, an operation space for inkjet printing can be enlarged without changing a length of the anode 20. As such, four or more nozzles can be simultaneously used to print an organic light-emitting layer 80 in a same pixel in bottom-emitting OLED devices. On the basis of the above description, the length of the pixel opening 31 along the second direction Y is greater than the length of the anode 20 disposed in the pixel opening 31 along the second direction Y. As such, along the second direction Y, four or more nozzles can also be used to print the organic light-emitting layer 80 of pixels, thereby improving printing efficiency of the nozzles.

Figure 10:
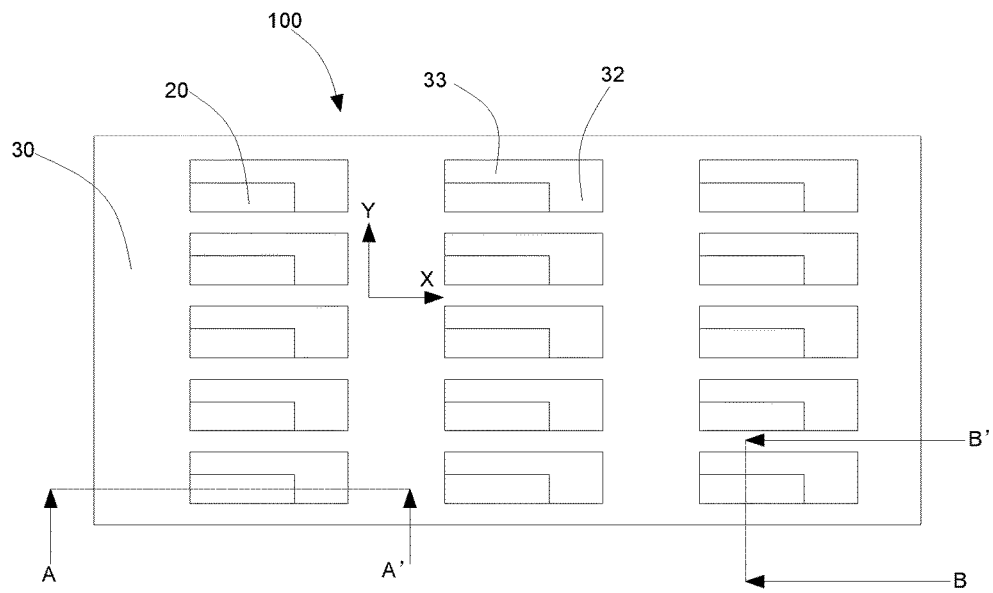
FIG. 10 is a fourth structural schematic view showing the OLED display panel provided by the present disclosure.
Figure 11:
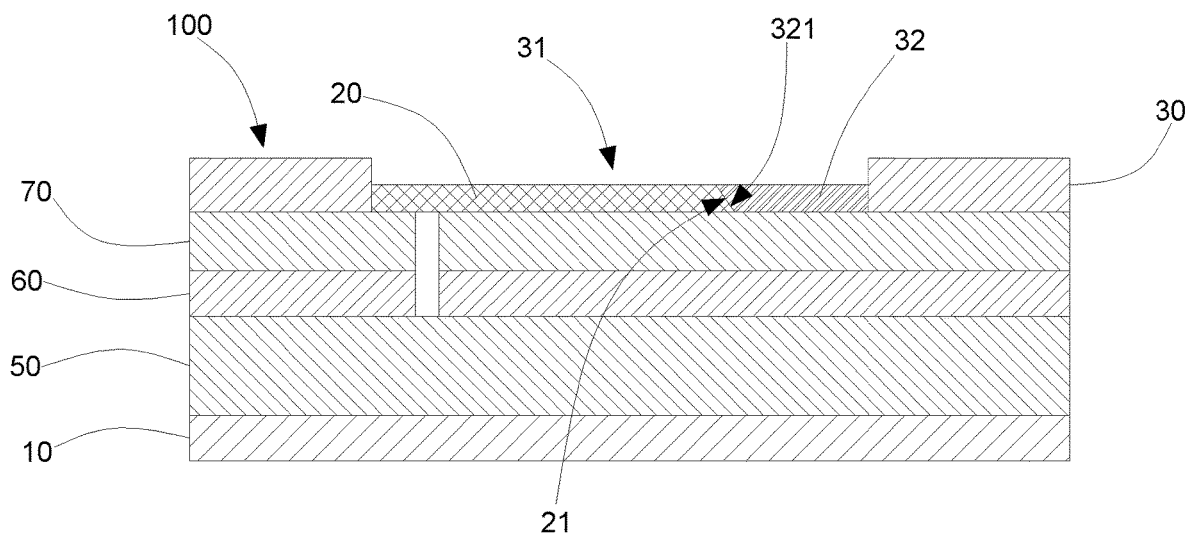
FIG. 11 is a cross-sectional view of FIG. 10 taken along a direction A-A'.
Figure 12:
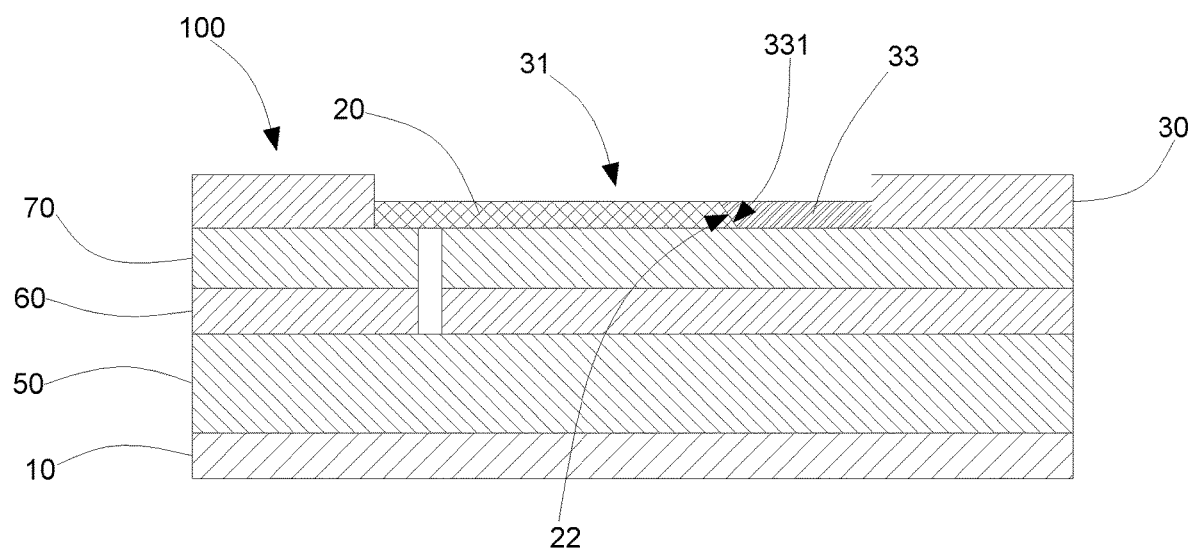
FIG. 12 is a cross-sectional view of FIG. 10 taken along a direction B-B'.

Please refer to FIGS. 10 to 12. FIG. 10 is a fourth structural schematic view showing the OLED display panel 100 provided by the present disclosure. FIG. 11 is a cross-sectional view of FIG. 10 taken along a direction A-A'. FIG. 12 is a cross-sectional view of FIG. 10 taken along a direction B-B'. In the present embodiment, on the basis of the OLED display panel 100 as shown in FIG. 5 and FIG. 7, a second filling layer 33 is disposed in the second gap 42 defined between the pixel opening 31 and the anode 20 along the second direction Y. A thickness of the second filling layer 33 and the thickness of the anode 20 may be same or different. In the present embodiment, the thickness of the second filling layer 33 and the thickness of the anode 20 are same. The second filling layer 33 can improve flatness of the anode 20, thereby improving a contact effect between the anode 20 and the organic light-emitting layer 80.

Moreover, a surface of the anode 20 in contact with the second filling layer 33 is a third contact surface 22. A surface of the second filling layer 33 in contact with the anode 20 is a fourth contact surface 331. The fourth contact surface 331 is defined on the third contact surface 22.

In the present disclosure, the fourth contact surface 331 is defined on the third contact surface 22. As such, the second filling layer 332 can cover the anode 20, thereby preventing the anode 20 from warpage.

Specifically, the third contact surface 22 and the fourth contact surface 331 are inclined surfaces. Because the third contact surface 22 and the fourth contact surface 331 are inclined surfaces cooperated with each other, the second filling layer 33 can cover the anode 20. In other embodiments of the present disclosure, the third contact surface 22 and the fourth contact surface 331 may be concave step surfaces.

Moreover, an end of the anode 20 along the second direction Y abuts against an internal wall of the pixel opening 31. The second gap 42 is defined between another end of the anode 20 along the second direction Y and the internal wall of the pixel opening 31. The second gap 42 is provided with the second filling layer 33. That is, only one end between the anode 20 and the internal wall of the pixel opening 31 along the first direction X is provided with a gap, which can alleviate affection due to contact between the anode 20 and the light-emitting layer 80.

In addition, the second filling layer 33 and the pixel defining layer 30 are made of same material. That is, the second filling layer 33 and the pixel defining layer 30 may be formed simultaneously. Specifically, the anode 20 is first disposed on the substrate 10, and then the pixel defining layer 30, together with the second filling layer 33, is formed on the substrate 10. Thus, manufacturing processes can be reduced, thereby reducing manufacturing cost. A translucent mask can be used during manufacturing processes of the pixel defining layer 30 and the first filling layer 32. The translucent mask includes a transparent area, an opaque area, and a translucent area. Because the translucent mask has areas having different light-transmitting degrees, the pixel defining layer 30 and the first filling layer 32 having different thicknesses can be formed simultaneously. As such, manufacturing steps can be reduced, and working efficiency is significantly improved.

Figure 13:
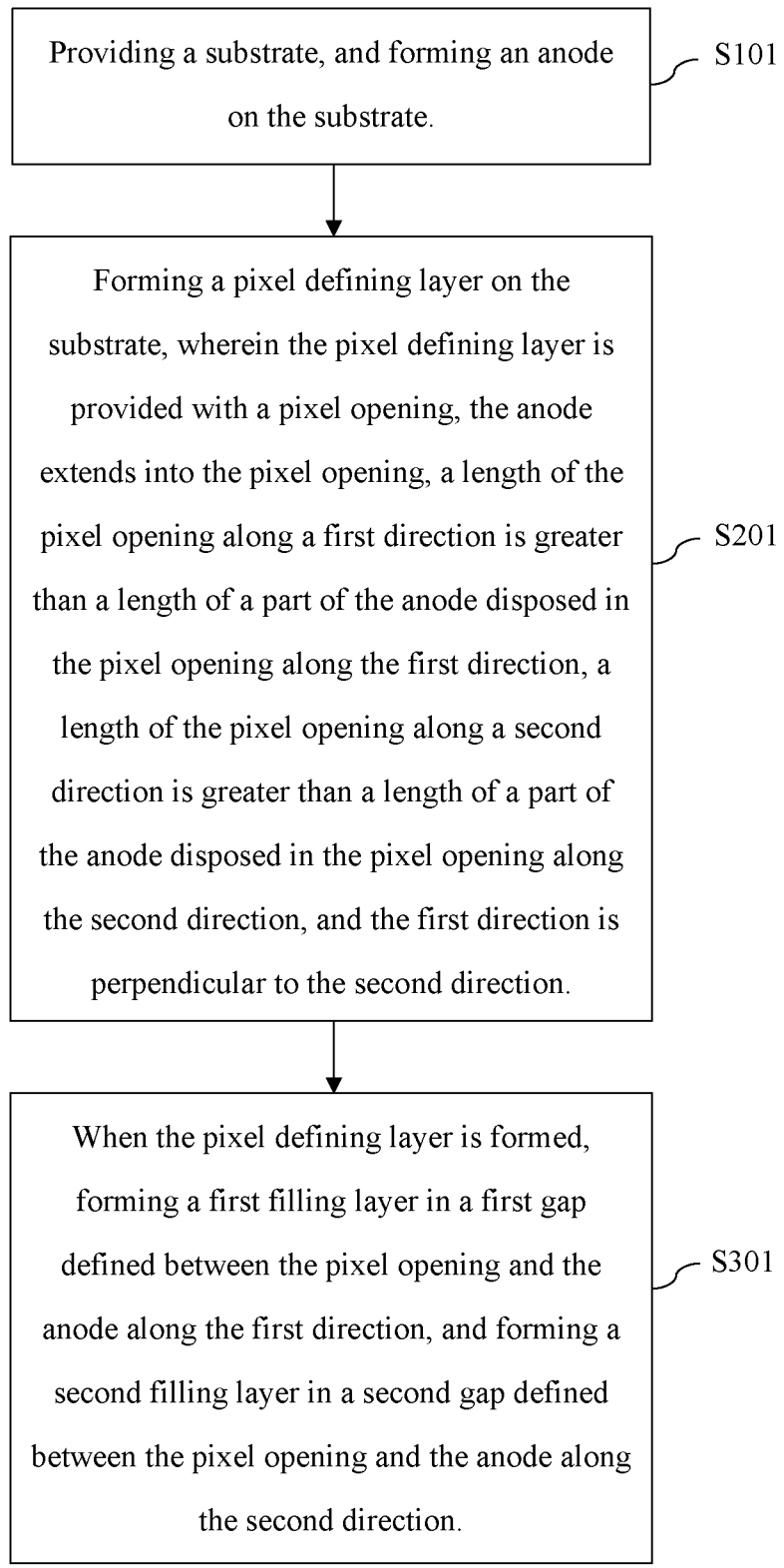
FIG. 13 is a flowchart showing a method of manufacturing the OLED display panel provided by a third embodiment of the present disclosure.

Please refer to FIG. 13. FIG. 13 is a flowchart showing a method of manufacturing the OLED display panel 100 provided by a third embodiment of the present disclosure. Correspondingly, an embodiment of the present disclosure further provides a method of manufacturing the OLED display panel 100, including following steps:

S101, providing the substrate 10, and forming the anode 20 on the substrate 10.

S201, forming the pixel defining layer 30 on the substrate 10. The pixel defining layer 30 is provided with the pixel opening 31. The anode 20 extends into the pixel opening 31. The length of the pixel opening 31 along a first direction X is greater than the part of the length of the anode 20 disposed in the pixel opening 31 along the first direction X. The length of the pixel opening 31 along the second direction Y is greater than the part of the length of the anode 20 disposed in the pixel opening 31 along the second direction Y. The first direction X is perpendicular to the second direction Y.

S301, when the pixel defining layer 30 is formed, forming the first filling layer 32 in the first gap 41 defined between the pixel opening 31 and the anode 20 along the first direction X, and forming the second filling layer 33 in the second gap 42 defined between the pixel opening 31 and the anode 20 along the second direction Y.

In the present embodiment, the second filling layer 33 and the pixel defining layer 30 are formed simultaneously. As such, manufacturing processes can be reduced, thereby reducing manufacturing cost.

Figure 14:
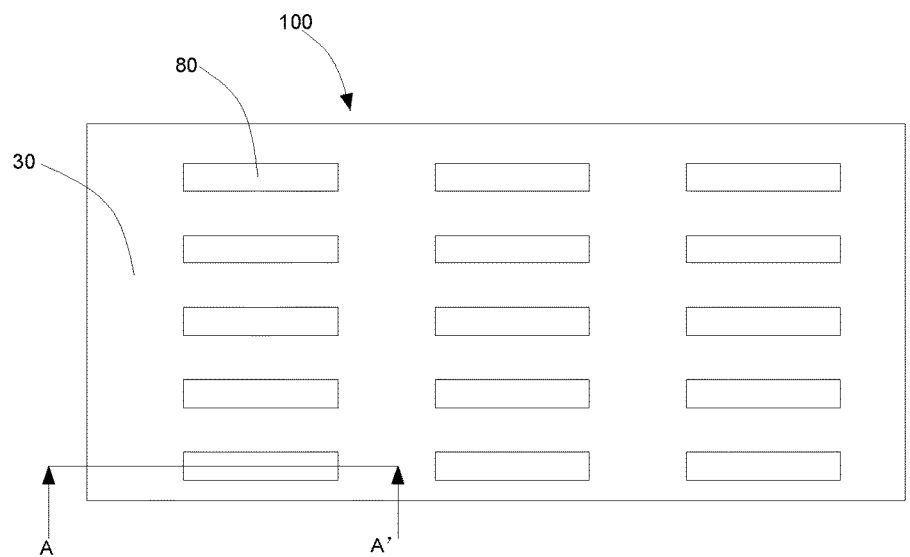
FIG. 14 is a fifth structural schematic view showing the OLED display panel provided by the present disclosure.
Figure 15:
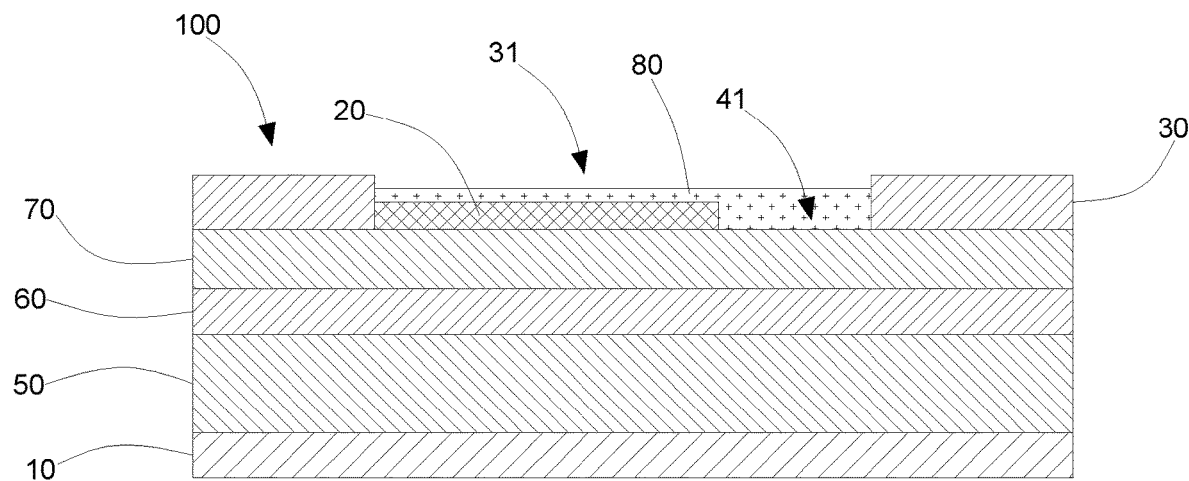
FIG. 15 is a cross-sectional view of FIG. 14 taken along a direction A-A'.

Please refer to FIG. 14 and FIG. 15. FIG. 14 is a fifth structural schematic view showing the OLED display panel 100 provided by the present disclosure. FIG. 15 is a cross-sectional view of FIG. 14 taken along a direction A-A'. In the present embodiment, on the basis of the OLED display panel as shown in FIG. 1, the OLED display panel 100 further includes:

the organic light-emitting layer 80, wherein the organic light-emitting layer 80 is disposed on the anode 20.

The organic light-emitting layer 80 is further disposed in the first gap 41 defined between the pixel opening 31 and the anode 20 along the first direction X. In addition, the organic light-emitting layer 80 is formed by an inkjet printing method.

That is, the present embodiment, the organic light-emitting layer 80 is filled in the first gap 41 defined between the pixel opening 31 and the anode 20 along the first direction X. The first filling layer 32 is the organic light-emitting layer 80. Therefore, a contact area between the anode 20 and the light-emitting layer 80 can be increased, thereby improving a contact effect between the anode 20 and the organic light-emitting layer 80.

Figure 16:
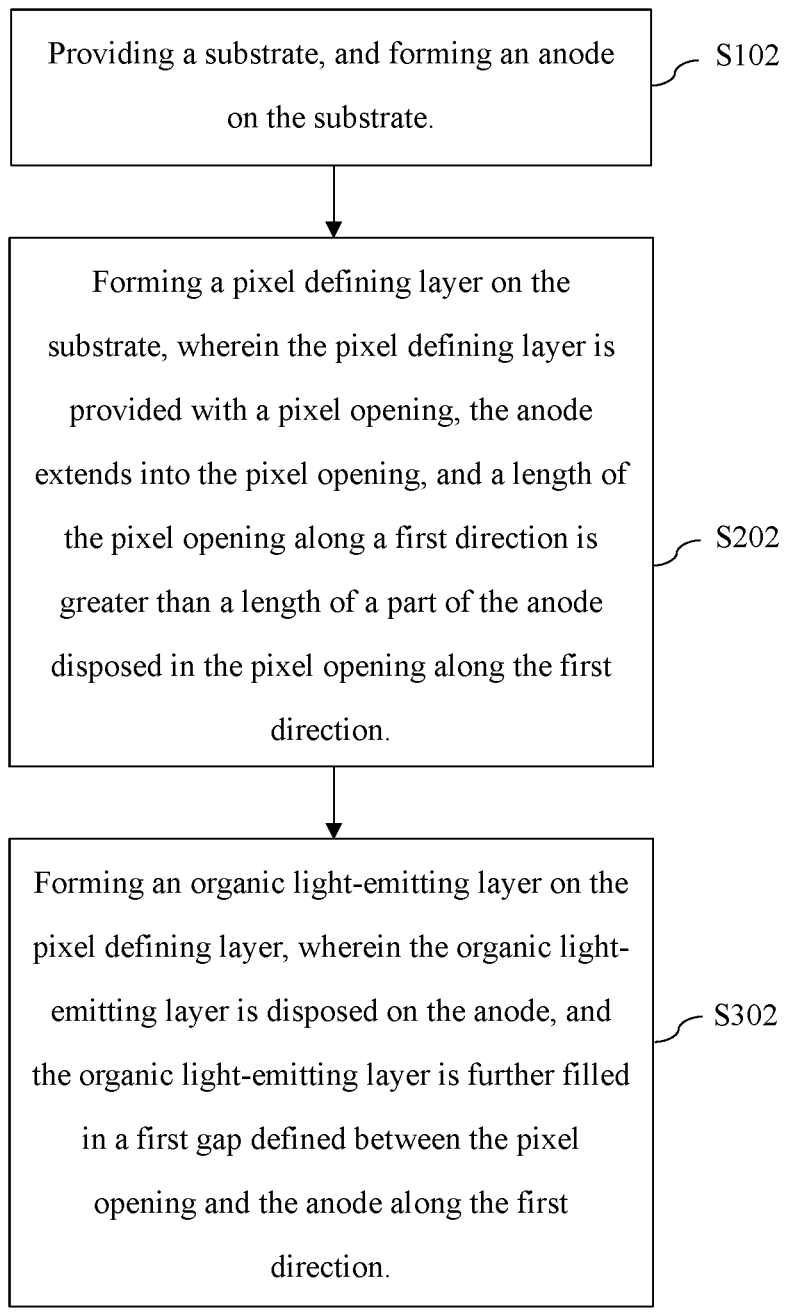
FIG. 16 is a flowchart showing a method of manufacturing the OLED display panel provided by a fourth embodiment of the present disclosure.

Please refer to FIG. 16. FIG. 16 is a flowchart showing a method of manufacturing the OLED display panel 100 provided by a fourth embodiment of the present disclosure. Correspondingly, an embodiment of the present disclosure further provides a method of manufacturing the OLED display panel 100, including following steps:

S102, providing the substrate 10, and forming the anode 20 on the substrate 10.

S202, forming the pixel defining layer 30 on the substrate 10. The pixel defining layer 30 is provided with the pixel opening 31. The anode 20 extends into the pixel opening 31. The length of the pixel opening 31 along the first direction X is greater than the length of the part the anode 20 disposed in the pixel opening 31 along the first direction X.

S302, forming the organic light-emitting layer 80 on the pixel defining layer 30.

The organic light-emitting layer 80 is disposed on the anode 20. The organic light-emitting layer 80 is further filled in the first gap 41 defined between the pixel opening 31 and the anode 20 along the first direction X. The organic light-emitting layer 80 is formed by an inkjet printing method.

In the present disclosure, the organic light-emitting layer 80 is formed on the anode 20, and is filled in the first gap 41 defined between the pixel opening 31 and the anode 20 along the first direction X. Therefore, manufacturing processes can be reduced, thereby reducing manufacturing cost.

Figure 17:
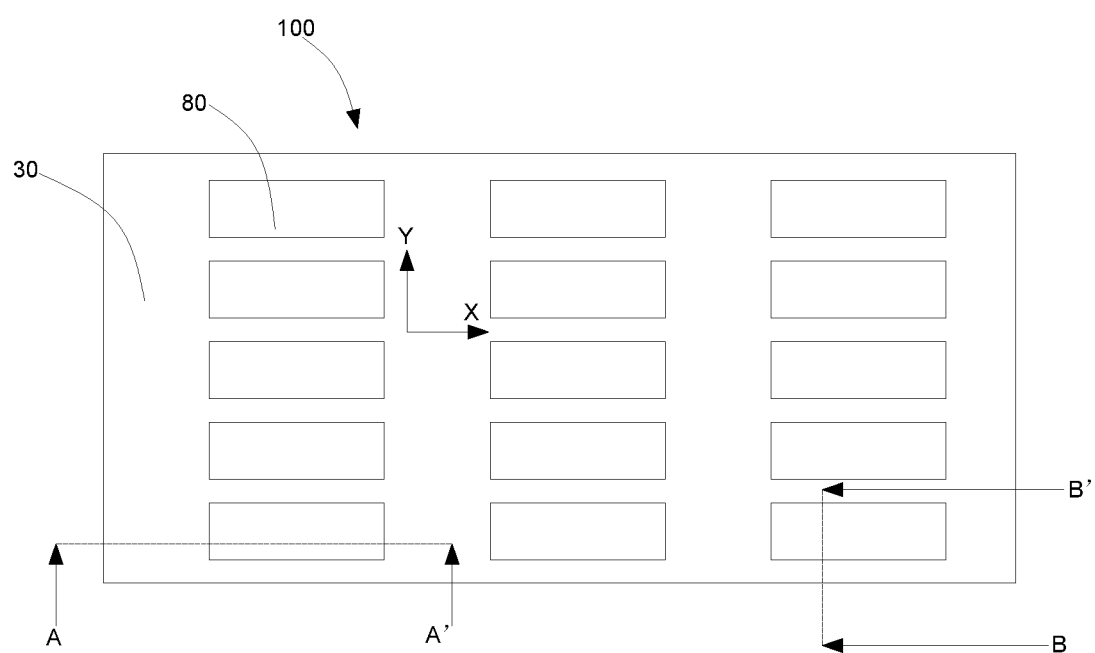
FIG. 17 is a sixth structural schematic view showing the OLED display panel provided by the present disclosure.
Figure 18:
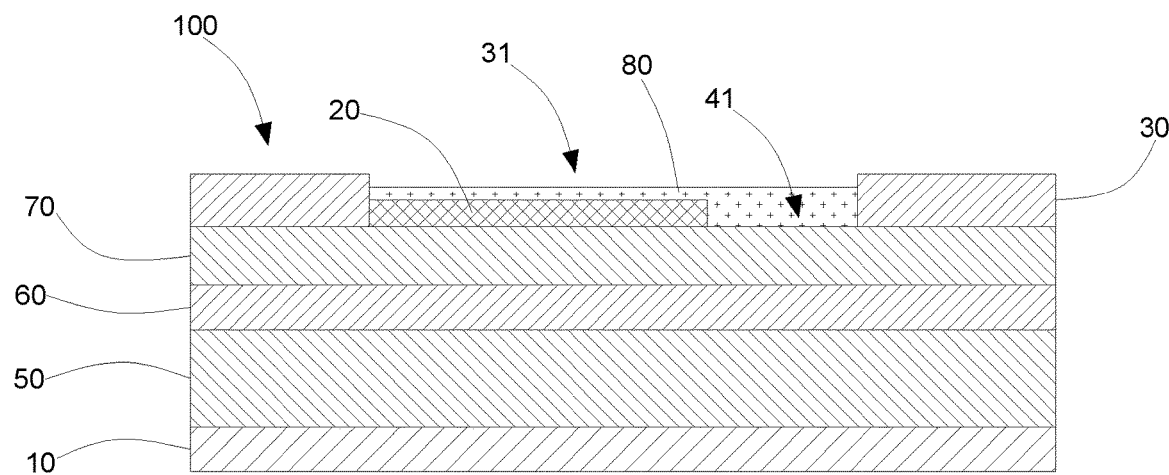
FIG. 18 is a cross-sectional view of FIG. 17 taken along a direction A-A'.
Figure 19:
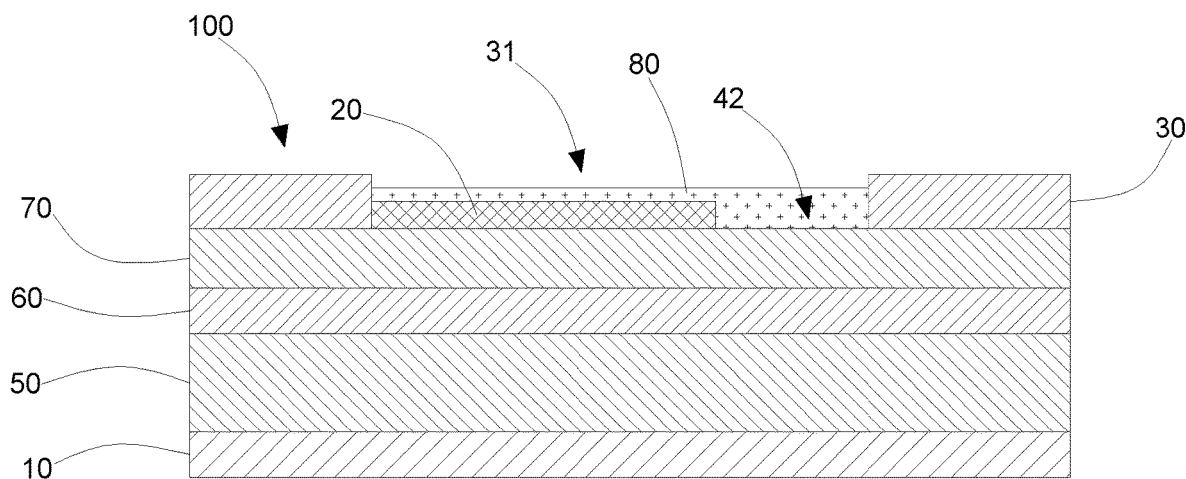
FIG. 19 is a cross-sectional view of FIG. 17 taken along a direction B-B'.

Please refer to FIGS. 17 to 19. FIG. 17 is a sixth structural schematic view showing the OLED display panel 100 provided by the present disclosure. FIG. 18 is a cross-sectional view of FIG. 17 taken along a direction A-A'. FIG. 19 is a cross-sectional view of FIG. 17 taken along a direction B-B'. In the present embodiment, on the basis of the OLED display panel 100 as shown in FIG. 7 and FIG. 14, the OLED display panel 100 further includes:

the organic light-emitting layer 80, wherein the organic light-emitting layer 80 is disposed on the anode 20.

The organic light-emitting layer 80 is further filled in the first gap 41 defined between the pixel opening 31 and the anode 20 along the first direction X. The organic light-emitting layer 80 is further filled in the second gap 42 defined between the pixel opening 31 and the anode 20 along the second direction Y.

That is, in the present embodiment, the organic light-emitting layer 80 is filled in the first gap 41 defined between the pixel opening 31 and the anode 20 along the first direction X. The first filling layer 32 is the organic light-emitting layer 80. The organic light-emitting layer 80 is filled in the second gap 42 defined between the pixel opening 31 and the anode 20 along the second direction Y. The second filling layer 33 is the organic light-emitting layer 80. Therefore, a contact area between the anode 20 and the organic light-emitting layer 80 can be increased, thereby improving a contact effect between the anode 20 and the organic light-emitting layer 80.

Figure 20:
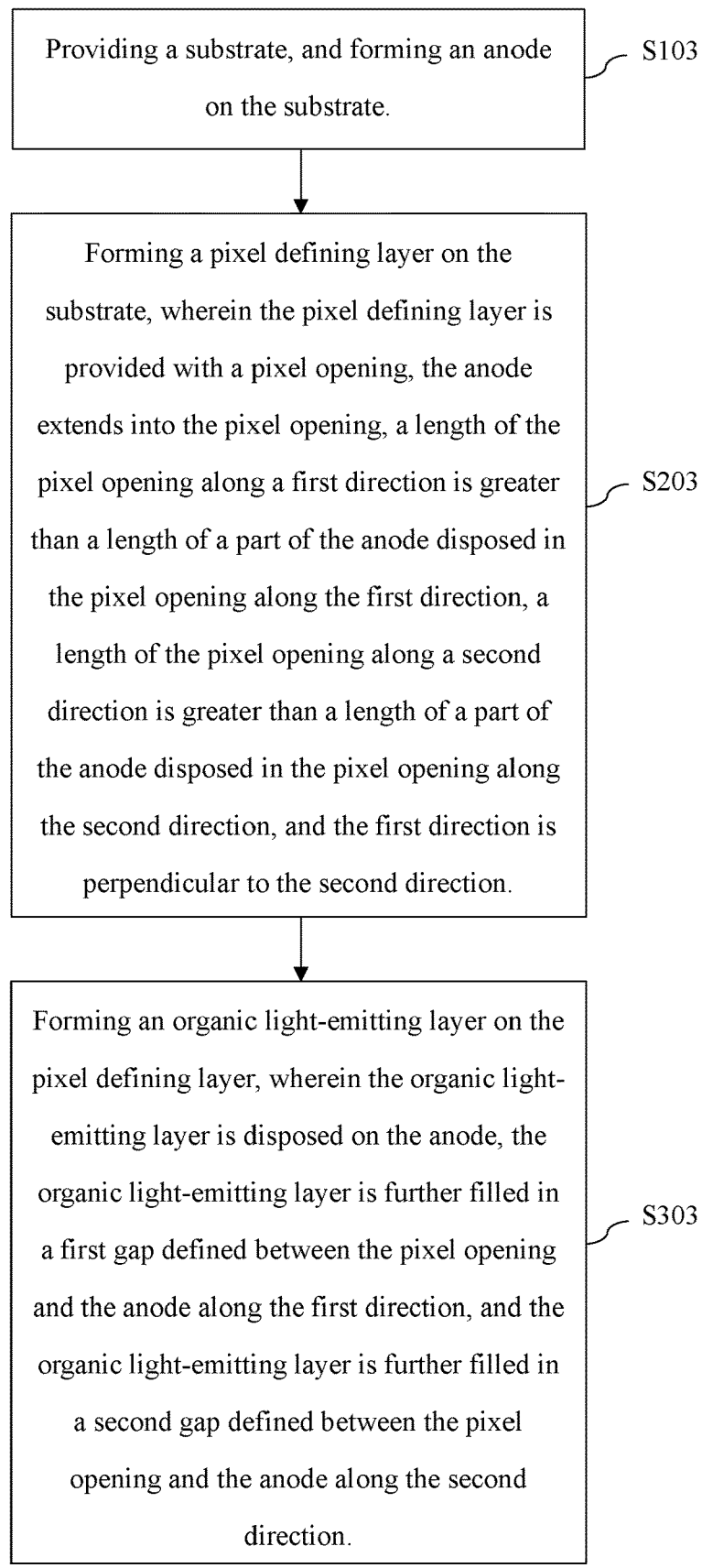
FIG. 20 is a flowchart showing a method of manufacturing the OLED display panel provided by a fifth embodiment of the present disclosure.

Please refer to FIG. 20. FIG. 20 is a flowchart showing a method of manufacturing the OLED display panel 100 provided by a fifth embodiment of the present disclosure. Correspondingly, an embodiment of the present disclosure further provides a method of manufacturing the OLED display panel 100, including following steps:

S103, providing the substrate 10, and forming the anode 20 on the substrate 10;

S203, forming the pixel defining layer 30 on the substrate 10. The pixel defining layer 30 is provided with the pixel opening 31. The anode 20 extends into the pixel opening 31. The length of the pixel opening 31 along the first direction X is greater than the part of the anode 20 disposed in the pixel opening 31 along the first direction X.

The length of the pixel opening 31 along the second direction Y is greater than the part of the anode 20 disposed in the pixel opening 31 along the second direction Y. The first direction X is perpendicular to the second direction Y S303, forming the organic light-emitting layer 80 on the pixel defining layer 30.

The organic light-emitting layer 80 is disposed on the anode 20. The organic light-emitting layer 80 is further filled in the first gap 41 defined between the pixel opening 31 and the anode 20 along the first direction X. The organic light-emitting layer 80 is further filled in the second gap 42 defined between the pixel opening 31 and the anode 20 along the second direction Y. The organic light-emitting layer 80 is formed by an inkjet printing method.

In the present embodiment, the organic light-emitting layer 80 is formed on the anode 20. The organic light-emitting layer 80 is filled in the first gap 41 defined between the pixel opening 31 and the anode 20 along the first direction X. The organic light-emitting layer 80 is filled in the second gap 42 defined between the pixel opening 31 and the anode 20 along the second direction Y. Therefore, manufacturing processes can be reduced, thereby reducing manufacturing cost.

A display device has been described in detail by the above embodiments, which illustrate principles and implementations thereof. However, the description of the above embodiments is only for helping to understand the technical solution of the present disclosure and core ideas thereof, and it is understood by those skilled in the art that many changes and modifications to the described embodiments can be carried out without departing from the scope and the spirit of the disclosure that is intended to be limited only by the appended claims.

What is claimed is:

1. An organic light-emitting diode (OLED) display panel, comprising:
   a substrate;
   an anode disposed on the substrate; and
   a pixel-defining layer disposed on the substrate, wherein the pixel-defining layer is provided with a pixel opening, and the anode extends into the pixel opening;
   wherein a length of the pixel opening along a first direction is greater than a length of a part of the anode disposed in the pixel opening along the first direction;
   wherein a length of the pixel opening along a second direction is greater than a length of a part of the anode disposed in the pixel opening along the second direction, and the first direction is perpendicular to the second direction, wherein the first direction and the second direction are in a plane parallel to the substrate.

2. The OLED display panel of claim 1, wherein a first gap is defined between the first pixel opening and anode along the first direction and is provided with a first filling layer.

3. The OLED display panel of claim 2, wherein a surface of the anode in contact with the first filling layer is a first contact surface, a surface of the first filling layer in contact with the anode is a second contact surface, and the second contact surface is defined on the first contact surface.

4. The OLED display panel of claim 2, wherein an end of the anode abuts against an internal wall of the pixel opening along the first direction, and the first gap is defined between another end of the anode and the internal wall of the pixel opening along the first direction.

5. The OLED display panel of claim 1, wherein a second gap is defined between the pixel opening and the anode along the second direction and is provided with a second filling layer.

6. The OLED display panel of claim 5, wherein a surface of the anode in contact with the second filling layer is a third contact surface, a surface of the second filling layer in contact with the anode is a fourth contact surface, and the fourth contact surface is defined on the third contact surface.

7. The OLED display panel of claim 5, wherein an end of the anode abuts against an internal wall of the pixel opening along the second direction, and the second gap is defined between another end of the anode and the internal wall of the pixel opening along the second direction.

8. The OLED display panel of claim 1, comprising:
   an organic light-emitting layer disposed on the anode;
   wherein the organic light-emitting layer is filled in a first gap defined between the pixel opening and the anode along the first direction.

9. The OLED display panel of claim 1, comprising:
   an organic light-emitting layer disposed on the anode;
   wherein the organic light-emitting layer is filled in a second gap defined between the pixel opening and the anode along the second direction.

10. A method of manufacturing an organic light-emitting diode (OLED) display panel, comprising following steps:
    providing a substrate, and forming an anode on the substrate;
    forming a pixel defining layer on the substrate, wherein the pixel defining layer is provided with a pixel opening, the anode extends into the pixel opening, a length of the pixel opening along a first direction is greater than a length of a part the anode disposed in the pixel opening along the first direction; a length of the pixel opening along a second direction is greater than a length of a part of the anode disposed in the pixel opening along the second direction, and the first direction is perpendicular to the second direction, wherein the first direction and the second direction are in a plane parallel to the substrate.

11. The method of claim 10, comprising a following step:
    when the pixel defining layer is formed, forming a first filling layer in a first gap defined between the pixel opening and the anode along the first direction.

12. The method of claim 10, comprising a following step:
    when the pixel defining layer is formed, forming a second filling layer in a second gap defined between the pixel opening and the anode along a second direction.

13. The method of claim 10, comprising a following step:
    forming an organic light-emitting layer on the pixel defining layer, wherein the organic light-emitting layer is disposed on the anode, the organic light-emitting layer is disposed in a first gap defined between the pixel opening and the anode, and the organic light-emitting layer is formed by an inkjet printing method.

* * * * *